US006352936B1

(12) United States Patent
Jehoul et al.

(10) Patent No.: US 6,352,936 B1
(45) Date of Patent: Mar. 5, 2002

(54) METHOD FOR STRIPPING ION IMPLANTED PHOTORESIST LAYER

(75) Inventors: Christian Jehoul, Houthalen-Helchteren; Kristel Van Baekel, Meerhout; Werner Boullart, Leuven; Herbert Struyf, Antwerpen; Serge Vanhaelemeersch, Leuven, all of (BE)

(73) Assignees: IMEC vzw, Leuven (BE); Matrix Integrated Systems, Richmond, CA (US)

( * ) Notice: Subject to any disclaimer, the term of this patent is extended or adjusted under 35 U.S.C. 154(b) by 0 days.

(21) Appl. No.: 09/257,626

(22) Filed: Feb. 25, 1999

Related U.S. Application Data

(60) Provisional application No. 60/076,319, filed on Feb. 27, 1998.

(30) Foreign Application Priority Data

Mar. 6, 1998 (EP) .......................... 988700480

(51) Int. Cl.[7] ............................................. H01L 21/302
(52) U.S. Cl. ....................................... 438/712; 438/710
(58) Field of Search ................................. 438/710, 712, 438/719, 718, 725; 252/79.1, 79.3, 79.4; 134/1, 1.1, 1.2, 1.3

(56) References Cited

U.S. PATENT DOCUMENTS

| | | | |
|---|---|---|---|
| 3,837,856 A | | 9/1974 | Irving et al. |
| 4,347,654 A | * | 9/1982 | Allen et al. ............... 29/576 B |
| 4,904,621 A | * | 2/1990 | Loewenstein et al. ...... 437/225 |
| 4,961,820 A | * | 10/1990 | Shinagawa et al. ......... 156/643 |
| 4,983,254 A | * | 1/1991 | Fujimura et al. ............ 156/643 |
| 5,007,983 A | * | 4/1991 | Lerner et al. ................ 156/643 |
| 5,338,399 A | * | 8/1994 | Yanagida et al. ........... 156/662 |
| 5,382,316 A | | 1/1995 | Hills et al. |
| 5,503,708 A | * | 4/1996 | Koizumi et al. .......... 156/643.1 |
| 5,669,979 A | * | 9/1997 | Elliot et al. ..................... 134/1 |
| 5,780,359 A | | 7/1998 | Brown et al. |
| 5,792,314 A | * | 8/1998 | Shima et al. ............. 156/643.1 |
| 5,814,156 A | * | 9/1998 | Elliot et al. ..................... 134/1 |
| 5,851,302 A | | 12/1998 | Solis |
| 5,925,577 A | * | 7/1999 | Solis et al. .................. 438/725 |
| 5,939,831 A | * | 8/1999 | Fong et al. ............. 315/111.21 |
| 5,961,772 A | * | 10/1999 | Selwyn ........................ 156/345 |

FOREIGN PATENT DOCUMENTS

| | | |
|---|---|---|
| EP | 0 123 813 A | 11/1984 |
| EP | 0 328 350 B1 | 8/1989 |
| EP | 0 379 301 A1 | 7/1990 |
| EP | 0 386 609 A1 | 9/1990 |
| EP | 0 304 068 B1 | 12/1992 |
| EP | 0 940 846 A1 | 9/1999 |

OTHER PUBLICATIONS

Wolf et al., Silicon Processing for the VLSI Era vol. I: Process Technology, Lattice Press, Sunset Beach, CA, USA, pp. 280–283, 314–316, 321–327, 518, 564–565, 1986.*
Patent Abstracts of Japan, vol. 1999, No. 07; Publication No.: 09181055; published Jul. 11, 1997; *abstract*.
European Search Report; Application No. EP 99 87 0036, no date.
European Search Report; Application No. EP 90 10 3922, no date.

* cited by examiner

*Primary Examiner*—Robert Kunemund
*Assistant Examiner*—Martha Anderson
(74) *Attorney, Agent, or Firm*—Knobbe, Martens, Olson & Bear LLP

(57) ABSTRACT

The present invention concerns a method for stripping the photoresist layer and the crust from a semiconductor. The crust has been formed with as a result of an ion implantation step, wherein the method comprises an ion assisted plasma step using a mixture of water vapour, helium and a F-containing compound in which radicals are generated, and the step of contacting said photoresist layer and crust with said radicals to remove said photoresist layer and crust from said semiconductor surface. Said plasma step is preferably an ion assisted plasma step.

19 Claims, 6 Drawing Sheets

METHOD FOR STRIPPING ION IMPLANTED PHOTORESIST LAYER

This application claims priority under 35 U.S.C. §119(e) of U.S. Provisional Application Ser. No. 60/076,319, filed Feb. 27, 1998.

FIELD OF THE INVENTION

The invention is situated in the field of production of semiconductor devices, more particularly related to the removal of high dose and high energy implanted photoresist layers.

STATE OF THE ART

A photoresist layer is used as a mask during the high dose and high energy ion implantation step in the manufacturing process of semiconductors. During the implantation step, the upper surface of the photoresist layer is transformed to a carbonised crust which contains Arsenic, Phosphorus and/or Boron dopants. The thickness of the crust as well as the depth of the implanted species are directly related to the implantation energy and the type of dopant. Under the crust layer, the remainder of the photoresist layer is still present. The next step is removing the crust and unaffected photoresist layer selective to the underlying siliconoxide.

The technique of ion implantation using photoresist layers as mask material and the subsequent removal of this implanted photoresist are discussed in several documents, such as "Wafer Cooling and Photoresist Masking Problems in Ion Implantation" by T. C. Smith, Motorola MOS group/Advanced Product R&D Labs, "Carbonised Layer Formation in Ion Implanted Photoresist" by K. J. Orvek and C. Huffman (Nucl. Instr. and Methods in Phys. Res., Vol B7/8(1985)p501), "Characterization of Ion-Implanted Photoresist Films by Fourier Transform Infrared Spectroscopy" by J. Lee, C. Lee, J. Alvis and S. W. Sun, Motorola Advanced Products and Developments Laboratory, Austin, and in "Ashing of Ion-Implanted Resist Layer" by S. Fujimura, J. Kono, K. Hikazutani and H. Yano (Japanese Journal of Applied Physics, Vol. 28, No. 10, October 1989, p. 2130), which are included by reference herein.

Standard dry strip processes are performed using a downstream oxygen plasma at high temperature (200–300° C.) to increase the striprate. The energy transfer from the high energy ions to the photoresist during the implantation process leads to high stress in the photoresist. During high temperature treatment the crust will pop off due to differential stress in the carbonised, implanted and plain resist regions. This is enhanced by the volatile content trapped in the unaffected resist underneath the hardened crust. The use of oxygen in dry plasma stripping will enable oxidation of the implanted species. These phenomena give existence to redeposited resist flakes and oxidised dopants, which are difficult to remove.

AIMS OF THE INVENTION

The aim of the invention is to provide a new method for stripping the photoresist layer from a semiconductor device that has been treated with an ion implantation step, in which photoresist layer, crust layer and residues are completely removed with minimal oxide loss.

SUMMARY OF THE INVENTION

The invention concerns a method for stripping the photoresist layer and the crust from a semiconductor, that has preferably been treated with an ion implantation step, wherein the method comprises an ion assisted plasma step using a mixture of water vapour, helium and a F-containing compound in which radicals are generated, and the step of contacting said photoresist layer and crust with said radicals to remove said photoresist layer and crust from said semiconductor surface.

Preferably, said F-containing compound is $CF_4$.

Preferably, said mixture is such that the screen oxide loss is less than half of the total oxide layer.

The ion implantation step is preferably a high dose and high energy ion implantation step. A high dose and high energy ion implantation step will give resist and crust layers that are hard to remove.

The ion assisted plasma step is preferably performed in an R.I.E. reactor. Preferably, the water vapour to helium ratio is comprised between 1:4 and 1:8.

The method according to the invention can further comprise a downstream oxygen plasma stripping step. Such step can be an $O_2$-containing afterglow ashing step. The method can further comprise the step of a post wet cleaning step. Said post wet cleaning step is preferably performed with means comprising sulphuric acid and hydrogen peroxide and/or means comprising $O_3$ and $H_2O$ and/or a DI water rinse.

Said ion assisted plasma step is preferably performed at a temperature between 15 and 140° C., advantageously at a temperature of about 40° C.

The RF power lies preferably between 200 and 1000 W, advantageously between 300 and 600 W.

The amount of water in the mixture lies preferably between 40 and 70 sccm.

In a preferred embodiment, the semiconductor, prior to the ion assisted plasma step using a mixture of water vapour, helium and $CF_4$, is subjected to an ion assisted plasma step using a mixture of water vapour and helium.

A dilution of the mixture with He results in a low water vapour flow combined with a high total flow. The low water vapour flow is advantageous for residue removal, while the high total flow is important to minimise oxide loss.

DETAILED DESCRIPTION OF THE INVENTION

The invention consists of using an optimised mixture of water vapour, helium and carbon tetrafluoride in the RIE plasma reactor, followed by a downstream oxygen plasma strip at high temperature.

Working at lower temperatures will eliminate resist popping, but the use of ionic bombardment is necessary to yield acceptable striprates. The resist layer is partially stripped in an RIE-type (Reactive Ion Etch) reactor using water vapour. This provides the hydrogen component which volatilises the implanted species in the crust layer by formation of As, B, or P hydrides. The remainder of the photoresist layer can then be removed in a downstream oxygen plasma process.

Ion implantation is performed through a screen oxide. This is a sacrificial oxide that is used to reduce channelling. The thickness of this screen oxide ranges from 15 to 40 nm. When scaling down devices, two implantation steps are performed subsequently to form source and drain regions, using the same screen oxide of typically 15 nm and two different photoresist masks. To be able to do this, oxide loss during stripping, especially for the first photoresist layer, must be minimised.

The use of water vapour has several disadvantages: it attacks silicon oxide and leaves residues along the structures. This is detailed below in the description of the figures.

Following the crust removal step as described higher, an $O_2$ afterglow ashing step can be used to remove any remaining resist.

A separate wet chemical clean can be performed to achieve complete residue removal. This residue clean-up step can be done e.g. with a mixture of sulphuric acid and hydrogen peroxide, volume 8 liters, ratio 4:1, at 80° C. during 10 minutes, followed by a rinse in deionized water. Another possibility is to use a cleaning procedure involving a moist $O_3$ gas phase process ($H_2O$—$O_3$ mixture) at 80° C. for 10 min. A combination of several methods is also possible.

The invention will be disclosed by means of examples, which are to be regarded as non-limiting to the scope of the invention as disclosed in this document.

Preparation of Test Wafers

Oxidised silicon wafers were coated with 870 nm Sumitomo I-line resist, exposed to I-line radiation, developed and baked on a hotplate at 100° C. These wafers were used in all examples for testing.

Implantation of phosphorus was performed through a 15 nm screen oxide, using a medium current ion implanter from Eaton. Implantation (I) and RIE strip (S) parameters are mentioned in table 1.

TABLE 1 common parameters for all examples

| Parameter (process) | Value |
|---|---|
| Ion type (I) | phosphorus |
| Energy (keV) (I) | 80 |
| Current (μA) (I) | 300 |
| Chuck temperature (° C.) (S) | 40 |

EXAMPLE 1

Example According to the Invention 1

Silicon wafers as described before were implanted with parameters such as in Table 1. The implantation dose was $5.10^{15}$ atoms/cm$^2$.

These wafers were exposed to a mixture of 67 sccm (Standard Cubic Centimeter: measurement at 760 mm Hg and 0° C.) water vapour and 400 sccm helium during 40 seconds, followed by exposition to a mixture of 67 sccm water vapour, 400 sccm helium and 3 sccm $CF_4$ during 20 seconds, both steps taking place in an RIE reactor (pressure at 650 millitorr, RF power at 500 W), resulting in removal of the crust without causing resist popping. The $H_2O$: He ratio of the mixture is 1:6.

This is followed by a downstream oxygen plasma stripping step. This step removed all the residues originating from both resist layer and implanted species. Residues residing on structures smaller than 1 μm were removed using a post wet cleaning step with a mixture of sulphuric acid and hydrogen peroxide (8 l, ratio 4:1) during 10 min at 80° C.

EXAMPLE 2

Example According to the Invention 2

The same process as in example 1 was used, except for the following differences:

implantation dose is $1.10^{16}$ atoms/cm$^2$ 500 sccm helium in both steps $H_2O$:He ratio of 1:7.5 a pressure is 700 millitorr 6 sccm $CF_4$ in second step.

The steps of downstream oxygen plasma stripping and wet cleaning result in a wafer that is free of residues.

EXAMPLE 3

Comparative Example 1

Silicon wafers as described higher were used. After an ion implantation with a dose of $1.10^{16}$ atoms/cm$^2$, the wafers are subjected to a pure water vapour plasma in an RIE reactor, resulting in the removal of the crust without any resist popping. Parameters for this step are:

60 seconds processtime, 150 sccm water vapour, pressure at 400 millitorr, and

RF power at 450–500 Watt.

The steps of downstream oxygen plasma stripping and wet cleaning such as described higher result in a wafer that still has polymeric residues in the resist covered areas and especially at the edges of the resist layer pattern.

EXAMPLE 4

Comparative Example 2

In this example, nearly the same process as described in example 3 is used, with the difference that the implantation dose is $5.10^{15}$ atoms/cm$^2$ at 400 millitorr and 500 Watt, a first stripping step (with water vapour) was performed during 50 seconds and with 50 sccm water vapour, followed by a second strip using a mixture of 200 sccm water vapour and 2 sccm $CF_4$ during 20 seconds.

Resist stripping was completed by downstream oxygen plasma stripping and wet cleaning, leaving residues long the pattern edge.

Oxide Loss and Residue Removal Results

TABLE 2

| | results | |
|---|---|---|
| Example number | Residue removal | Oxide loss (nm) |
| 1 | complete | 1.7 |
| 2 | complete | 1.9 |
| 3 | unsatifying | not measured |
| 4 | incomplete | 7 |

BRIEF DESCRIPTION OF THE FIGURES

FIGS. 1 to 4 show elements of the invention. The use of higher water vapour flows reduces the oxide loss significantly (FIG. 3). It retards the start of oxide loss by several seconds and results in a decrease in total oxide loss after 50 seconds processtime (compare FIGS. 1 and 2). In FIG. 1, (1) represents the thermal oxide loss, (2) the implanted oxide loss and (3) the patterned implanted oxide loss. FIG. 4 shows that the second step, after a first step using 50 sccm water vapour for 50 seconds, using high water vapour flows (200 sccm) after 50 seconds (with 2 sccm $CF_4$), does not contribute significantly to the oxide loss in a two-step process. Depicted are the oxide loss during resist strip (400 mTorr and 500 W) (4) using the two-step process and resist strip followed by a downstream oxygen plasma stripping step ($O_2/N_2/240°$ C. for 40 seconds) (5) starting with a 15 nm oxide layer.

These figures show the results of prior art processes that have acceptable oxide loss values. However, residue removal is not sufficient in these processes.

Figure 1:
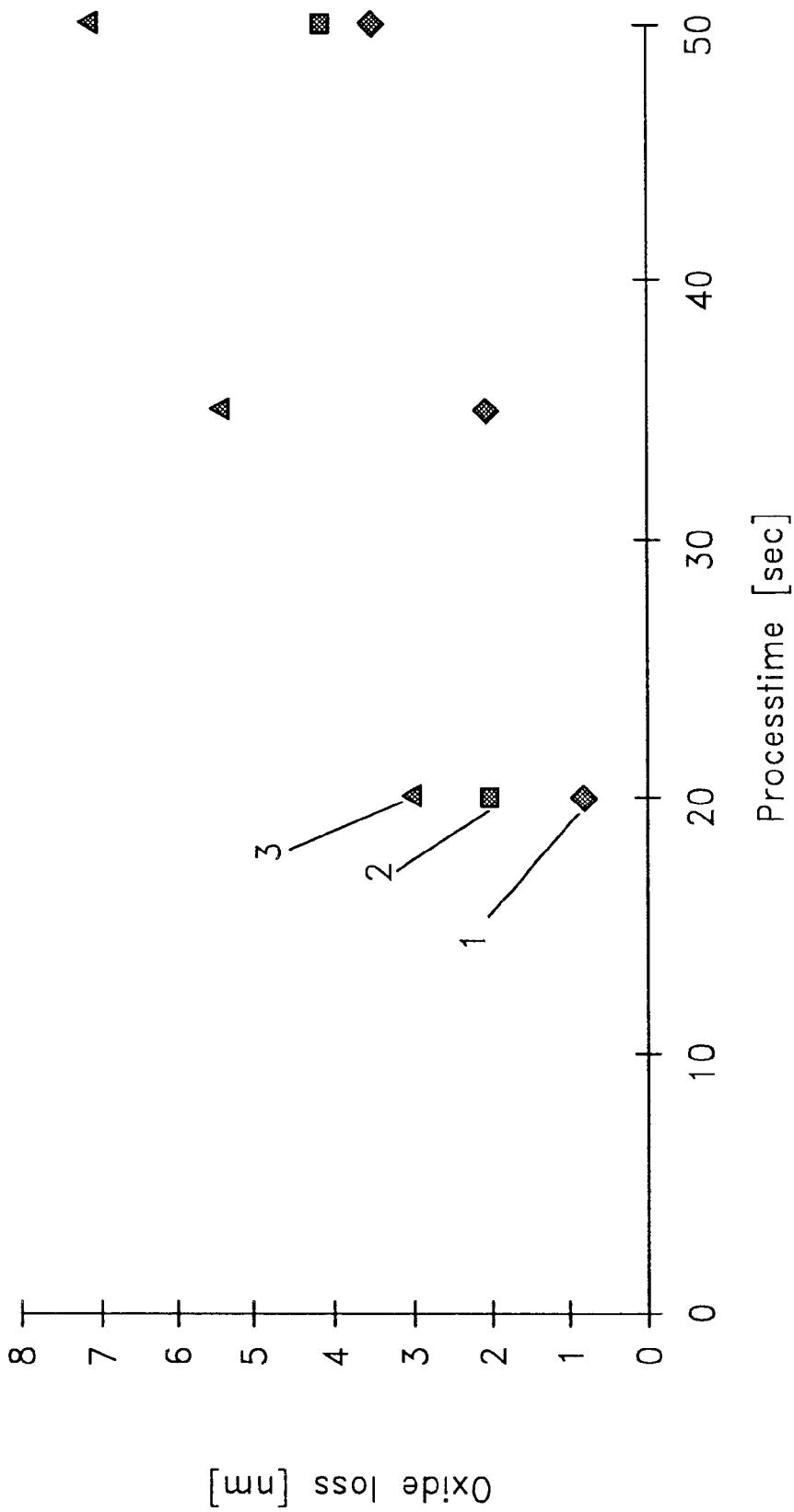
FIG. 1 represents the oxide loss of the screen oxide when using pure water vapour (400 mTorr, 500 W, 50 sccm).
Figure 2:
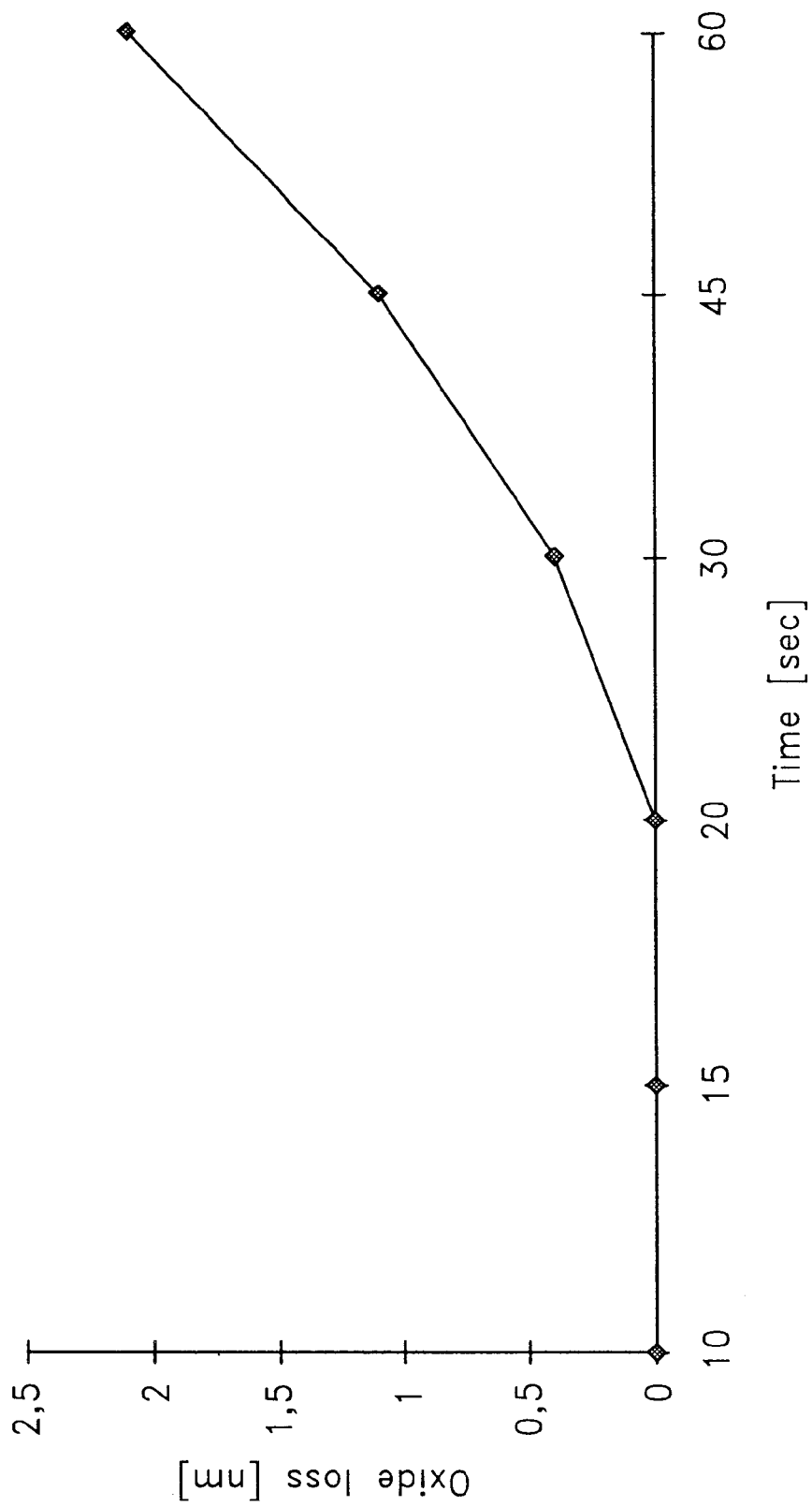
FIG. 2 describes the oxide loss of the screen oxide when using a 200 sccm water and 2 sccm $CF_4$ mixture. (400 mTorr, 500 W). The thermal oxide layer is 15 nm thick.
Figure 3:
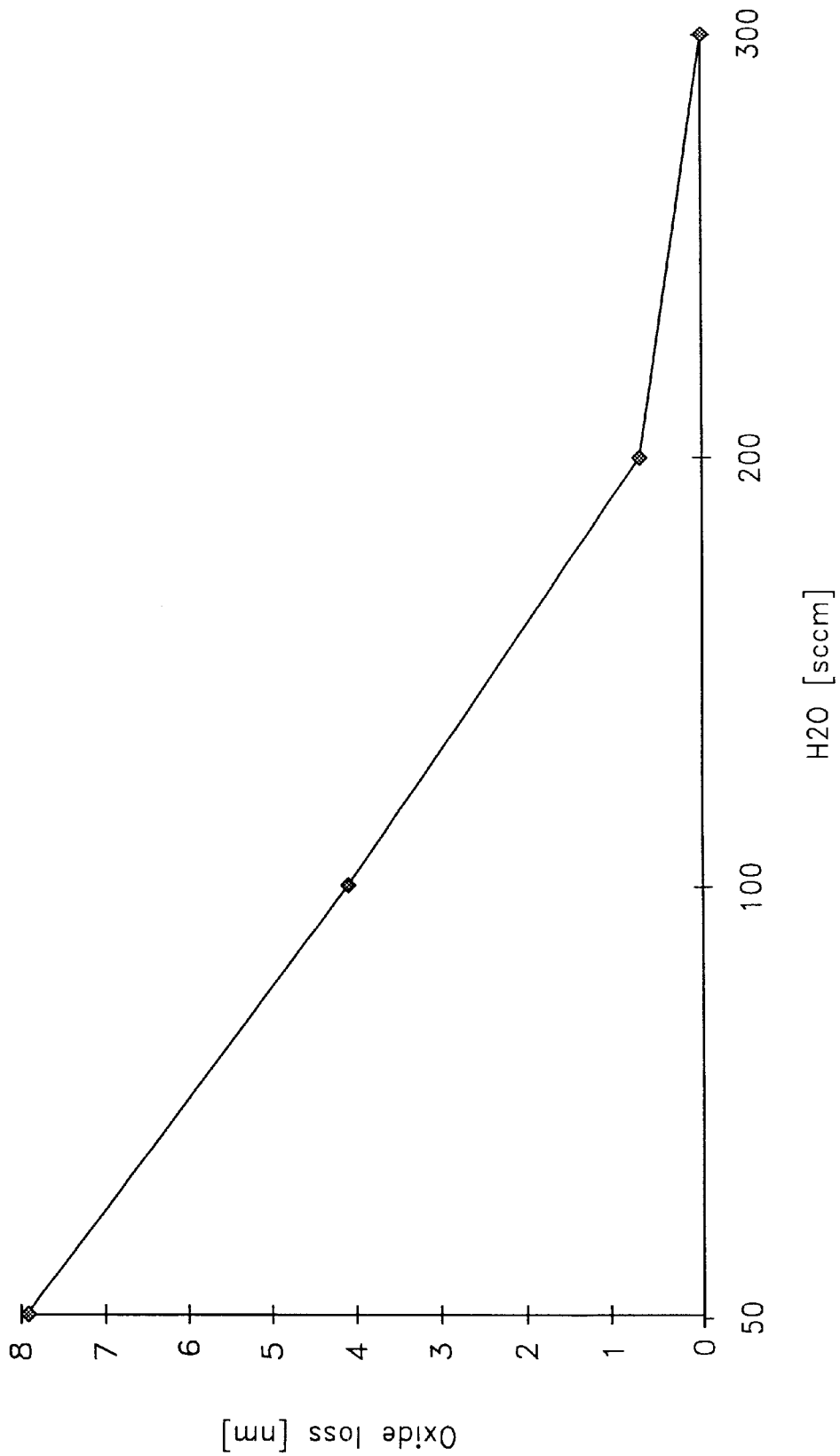
FIG. 3 describes the relation between oxide loss of the screen oxide and water vapour flow for the removal of a patterned implanted resist. Process parameters are 400 mTorr, 500 W and 50 seconds.
Figure 4:
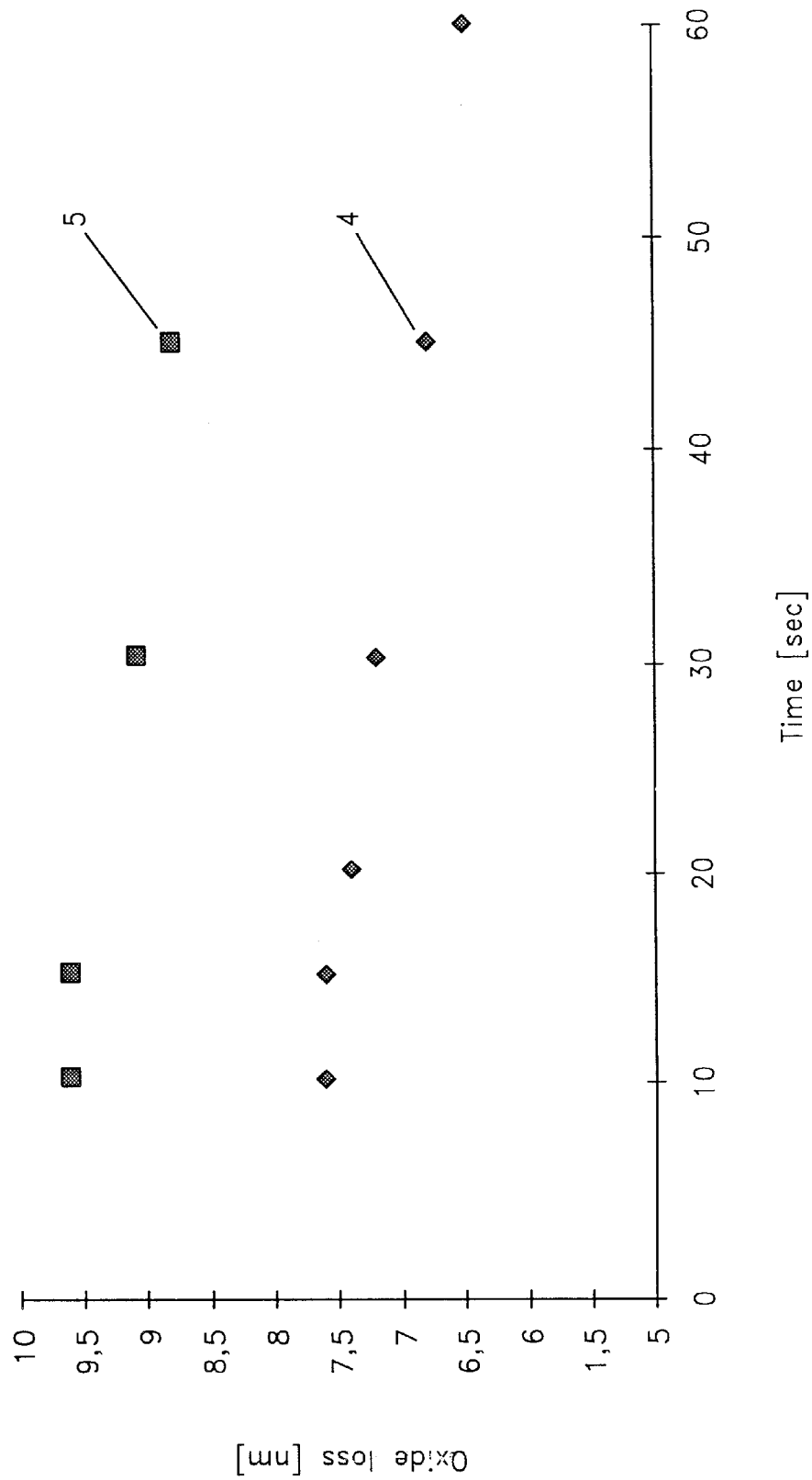
FIG. 4 shows the oxide loss of the screen oxide during a two step process which is an intermediate process between the prior art processes and the process according to the invention. It is part of demonstrating that the water flow is the main parameter causing residue and oxide loss.
Figure 5:
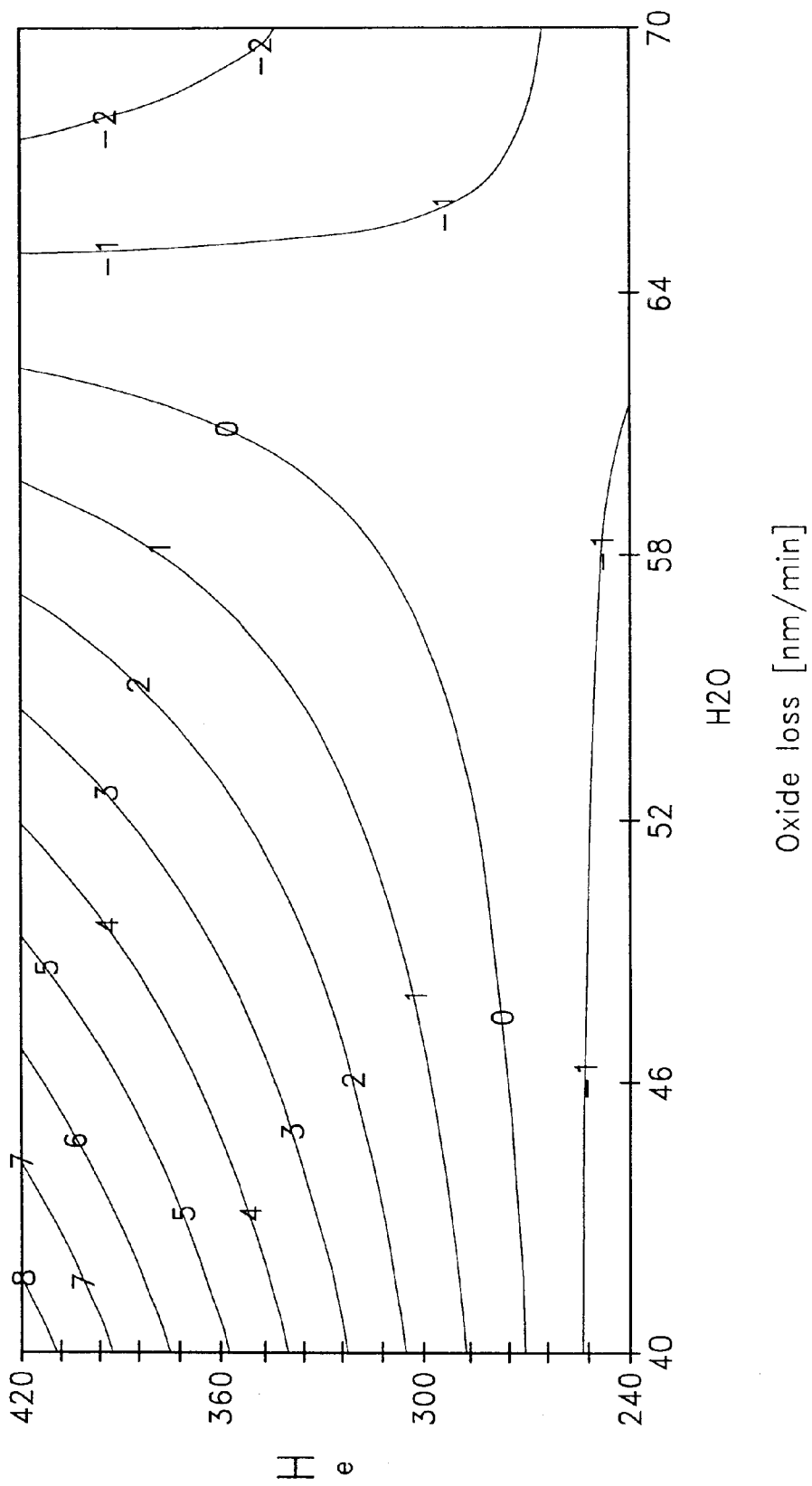
FIG. 5 discloses the oxide loss of the screen oxide in relation to the Helium and water vapour flows.
Figure 6:
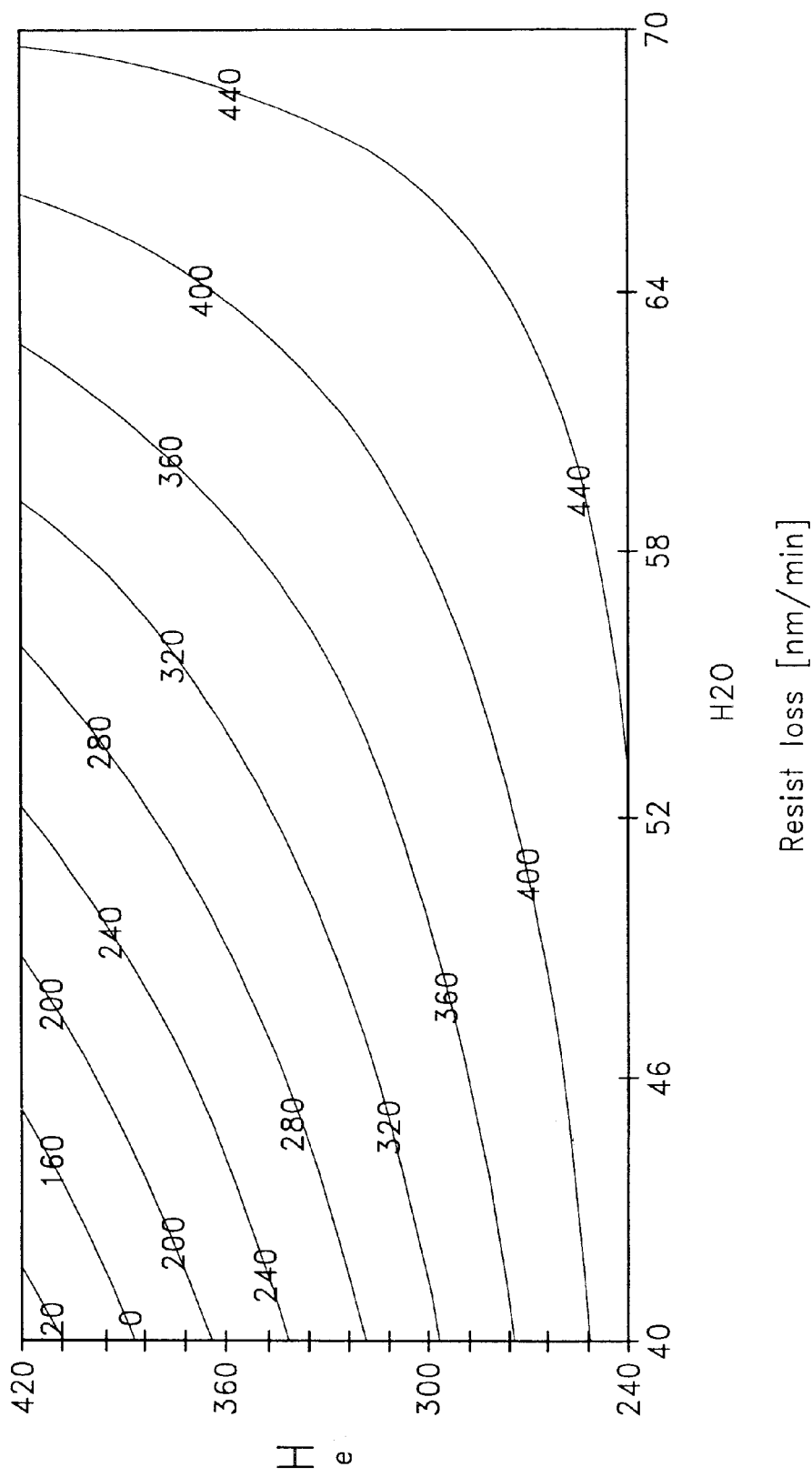
FIG. 6 represents resist loss in relation to the Helium and water vapour flows.

The results with the water/He/$CF_4$ mixture, according to the invention, are shown in FIGS. 5 and 6.

In FIG. 5, the relation between oxide loss and Helium and water vapour flows is drawn. Positive numbers mean oxide loss, negative values indicate an increase in thickness. The results were achieved on 15 nm implanted oxide without resist patterning. Real processwafers with resist patterning will show higher oxide loss. Further, the curves will shift depending on implantation parameters. Process parameters are 650 mTorr, 2 sccm $CF_4$, 500 Watts and 60 seconds processtime.

FIG. 6 gives the amount of resist loss in nm/min in relation to the Helium and water flow. Striprates were measured on unpatterned and non-implanted resist wafers. Implanted resist can result in lower striprates. Process parameters are 650 mtorr, 500 Watts and 60 seconds processtime.

What is claimed is:

1. A method for stripping a photoresist layer and crust from a semiconductor surface, wherein the method comprises a first ion assisted plasma step using a mixture of water vapour and helium and a second ion assisted plasma step using a mixture of water vapor, helium and a F-containing compound in which radicals are generated and the step of contacting said photoresist layer and crust with said radicals to remove said photoresist layer and crust from said semiconductor surface.

2. The method as recited in claim 1, wherein the F-containing compound preferably is $CF_4$.

3. The method as recited in claim 1, further comprising an ion implantation step, wherein the ion implantation step is conducted before the first ion assisted plasma step or the second ion assisted plasma step.

4. The method as recited in claim 3, wherein the ion implantation step is a high dose and high energy ion implantation step.

5. The method as recited in claim 1, wherein said mixture of water vapor and helium or said mixture of water vapor, helium and the F-containing compound is such that a screen oxide loss is less than a half of a total oxide layer.

6. The method as recited in claim 1, wherein the first ion assisted plasma, step or the second ion assisted plasma step is performed in an R.I.E. reactor.

7. The method as recited in claim 1, further comprising a downstream oxygen plasma stripping step.

8. The method as recited in claim 7, wherein said downstream oxygen plasma stripping step is an $O_2$ afterglow ashing step.

9. The method as recited in claim 1, wherein the water vapor to helium ratio in the first ion assisted plasma step or the second ion assisted plasma step is comprised between 1:4 and 1:8.

10. The method as recited in claim 1, wherein the crust is formed by ion implantation.

11. The method as recited in claim 1, further comprising a post wet cleaning step.

12. The method as recited in claim 11, wherein said post wet cleaning step is performed with means comprising sulphuric acid and hydrogen peroxide.

13. The method as recited in claim 11, wherein said post wet cleaning step is performed with means comprising $O_3$ and $H_2O$.

14. The method as recited in claim 1, wherein said first ion assisted plasma step or said second ion assisted plasma step is performed at a temperature between 15 and 140° C.

15. The method as recited in claim 1, wherein said first ion assisted plasma step or said second ion assisted plasma step is performed at a temperature of about 40° C.

16. The method as recited in claim 1, wherein the RF power of the first ion assisted plasma step or the second ion assisted plasma step lies between 200 and 1000 W.

17. The method as recited in claim 1, wherein the RF power of the first ion assisted plasma step or said second ion assisted plasma step lies between 300 and 600 W.

18. The method as recited in claim 1, wherein an amount of water in the mixture of water vapor and helium or an amount of water in the mixture of water vapor, helium and the F-containing compound lies between 40 and 70 sccm.

19. The method as recited in claim 1, wherein the crust comprises dopants, and wherein the dopants are selected from the group consisting of Arsenic, Phosphorus and Boron dopants.

* * * * *